(12) United States Patent
Min et al.

(10) Patent No.: US 7,466,583 B2
(45) Date of Patent: Dec. 16, 2008

(54) MRAM WITH SPLIT READ-WRITE CELL STRUCTURES

(75) Inventors: Tai Min, San Jose, CA (US); Po-Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 34 days.

(21) Appl. No.: 11/331,998

(22) Filed: Jan. 13, 2006

(65) Prior Publication Data

US 2007/0164380 A1 Jul. 19, 2007

(51) Int. Cl.
  *G11C 11/00* (2006.01)
  *G11C 11/14* (2006.01)
  *G11C 11/15* (2006.01)
  *H01L 21/8246* (2006.01)

(52) U.S. Cl. .................. 365/158; 365/171; 365/173; 257/E21.665

(58) Field of Classification Search .................. None
See application file for complete search history.

(56) References Cited

U.S. PATENT DOCUMENTS

| | | | | |
|---|---|---|---|---|
| 6,166,948 A | | 12/2000 | Parkin et al. | 365/173 |
| 6,833,573 B1 | | 12/2004 | Worledge | 257/295 |
| 6,900,489 B2 | | 5/2005 | Drewes | 257/295 |
| 7,088,611 B2 | * | 8/2006 | Braun | 365/171 |
| 2002/0141233 A1 | * | 10/2002 | Hosotani et al. | 365/158 |
| 2006/0022237 A1 | * | 2/2006 | Byun et al. | 257/295 |
| 2006/0146601 A1 | * | 7/2006 | Miltat et al. | 365/171 |
| 2007/0074317 A1 | * | 3/2007 | Pakala et al. | 977/935 |
| 2007/0097734 A1 | * | 5/2007 | Min et al. | 365/158 |
| 2007/0171694 A1 | * | 7/2007 | Huai et al. | 365/145 |

* cited by examiner

*Primary Examiner*—Andy Huynh
*Assistant Examiner*—Hoang-Quan Ho
(74) *Attorney, Agent, or Firm*—Saile Ackerman LLC; Stephen B. Ackerman

(57) ABSTRACT

An MRAM cell is formed in two separate portions. A first portion, that includes a pinned layer, a tunneling barrier layer and first free layer part, is used to read the value of a stored bit of information. A second portion includes a second free layer part on which information is written and stored. The second free layer part is formed with a high aspect ratio cross-section that renders it strongly magnetically anisotropic and enables it to couple to the relatively isotropic first free layer through a magnetostatic interaction. This interaction aligns the magnetization of the first free layer part in an opposite direction to the magnetization of the second free layer part. The magnetic orientation of the first free layer part relative to that of its adjacent pinned layer determines the resistance state of the first cell portion and this resistance state can be read by passing a current through the first cell portion. Thus, in effect, the first cell portion becomes a remote sensing device for the magnetization orientation of the second free layer part.

25 Claims, 4 Drawing Sheets

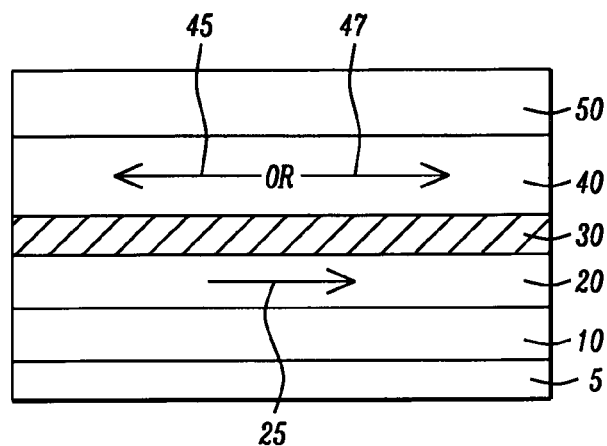
FIG. 1 - Prior Art
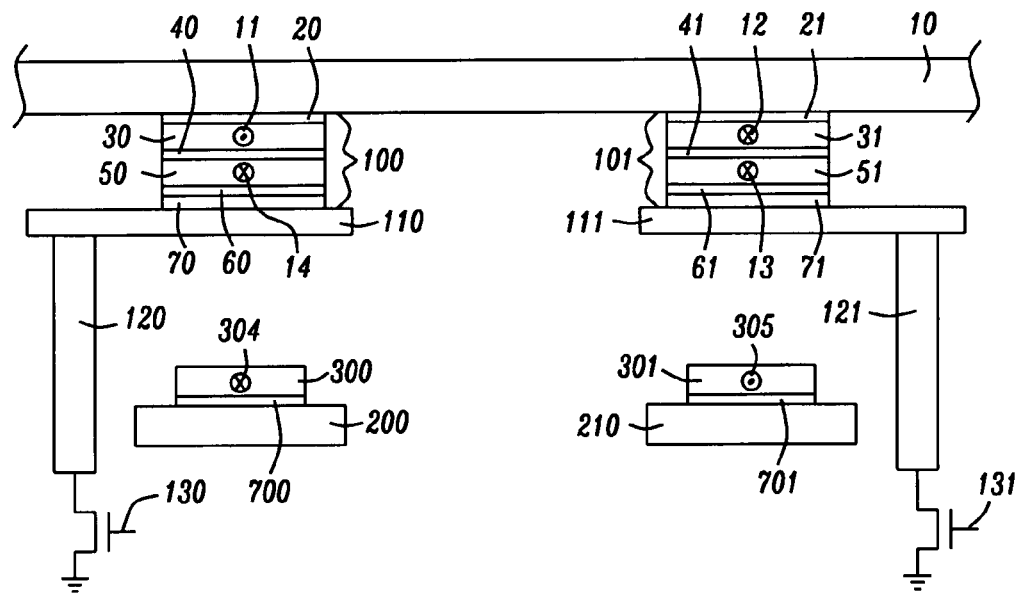
FIG. 2

MRAM WITH SPLIT READ-WRITE CELL STRUCTURES

BACKGROUND OF THE INVENTION

1. Field of the Invention

This invention relates generally to a magnetoresistive random access memory (MRAM) cell formed in a magnetic tunneling junction (MTJ) configuration and particularly to a form of such cell in which the read and write functions of the cell are assigned to different free layers.

2. Description of the Related Art

The magnetic tunneling junction (MTJ) device, is a form of giant magnetoresistive (GMR) device in which the relative orientation of uni-directional magnetic moments in parallel, vertically separated upper and lower magnetized layers, controls the flow of spin-polarized electrons tunneling through a very thin dielectric layer (the tunneling barrier layer) formed between those layers. When injected electrons pass through the upper layer they are spin polarized by interaction with the magnetic moment of that layer. The probability of such an electron then tunneling through the intervening tunneling barrier layer into the lower layer then depends on the availability of states within the lower electrode that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer. The MTJ device can therefore be viewed as a kind of variable resistor, since different relative orientations of the magnetic moments will change the magnitude of a current passing through the device.

FIG. 1 is a schematic cross-sectional view of a typical MTJ layer structure formed in what is called a spin-filter configuration. In this particular form, the lower one of the two magnetized layers. now called a pinned layer, has the direction of its magnetic moment fixed in direction, while the magnetic moment of the upper or free layer remains free to move in response to external stimuli. Looking from the bottom up, the layer configuration includes of a seed layer (5), that is used as a foundation on which to form successive overlayers. A layer of antiferromagnetic material. the AFM layer (10). is formed on the seed layer and will be used to pin the magnetic moment of the pinned layer by a form of magnetic coupling called exchange coupling. The lower, pinned layer (20) is a layer of ferromagnetic material formed on the AFM layer, or it can be a pair of ferromagnetic layers separated by a non-magnetic coupling layer. The tunneling barrier layer or junction layer (30) is then formed on the pinned layer, typically by first forming a layer of a metal such as aluminum (or magnesium) and then subjecting the aluminum to oxidation. The free layer (40) is a ferromagnetic layer that is then formed on the junction layer. Finally, a protective capping layer (50) is formed on the free layer.

If the magnetization of the free layer is allowed to move continuously. as when it is acted on by a continuously varying external magnetic field, the MTJ device can be used as a read-head for sensing magnetic field variations produced by moving magnetically recorded media. If the magnetization of the free layer is constrained to move in only two directions, eg. parallel to or antiparallel to the magnetization of the pinned layer, then the MTJ device can be used as a memory device, called a magnetic random access memory device or MRAM. When used as an MRAM, the MTJ device provides only two resistance values, maximum resistance in the anti-parallel orientations of the free and pinned layer magnetizations and minimum resistance in their parallel orientation. Thus, when the device in one of its two resistance states it can be said to store a logical zero or one. By sensing the resistance state, which requires the passage of a current through the device, the device is "read," and by changing the resistance state, which requires an external magnetic field produced adjacent current-carrying conductors, the device is written upon. As noted, the reading and writing of such a device is accomplished by its interaction with the magnetic fields of current carrying lines, called word lines and bit lines, that are vertically separated and typically pass above and below the MTJ device in mutually perpendicular directions. During quiescent states of the cell, when there are neither currents nor fields interacting with it, the cell stores information, meaning that the magnetic orientation of its free layer remains fixed.

In order that the read, write and storage operations be performed efficiently, it is desired that the magnetization of the free layer remains preferentially aligned or anti-aligned with the magnetization of the pinned layer when the cell is in a quiescent state, that is, when magnetic fields and/or currents are not being applied to it. The ability of the cell to maintain this alignment is what makes it an effective storage device. FIG. 1 shows an arrow (25) representing the fixed magnetic moment of the pinned layer and two arrows (45) and (47), representing the two possible directions of the free layer magnetic moment corresponding to low (45) and high (47) resistance of the cell.

In order to make the free layer retain its magnetization direction when the cell is quiescent, the free layer is provided with a degree of magnetic anisotropy, meaning that its magnetization prefers a particular direction. Typically, this anisotropy is "shape anisotropy," which is the result of making the cell longer in one direction than another, for example, by making the horizontal cross-sectional shape elliptical rather than circular. However, if the free layer is given a great deal of magnetic anisotropy, it will hold its magnetization very effectively but it will be increasingly difficult to change that direction when it is required to write upon the cell. Thus, there is a trade-off between the storage capability of a cell and the energy that must be expended to write upon that cell.

There are several factors that affect the performance of an MRAM cell having the configuration described above.

a) The magnetic coupling between the free and pinned layer is affected by the roughness of the oxide layer between them. The role of surface roughness in coupling the magnetization of the free and pinned layers is often called the "orange peel" effect (or Neel coupling) and it plays a role in establishing the switching threshold of a cell.

b) The uncompensated magnetic poles at the edges of the pinned layer (ie., the divergence of the magnetization vector at the edges of the layer) produces a bias against the switching of the free layer and, thereby, renders the switching threshold non-uniform among an array of cells.

c) For reliable switching behavior, the ferromagnetic free layer is generally limited to being formed of materials with small intrinsic coercivity. This makes it disadvantageous to use certain materials that produce a high magnetoresistive (MR) ratio (Dr/r), such as CoFeB and CoFe, whose high concentration of Fe produce good MR ratios, but which have generally higher intrinsic coercivities causing large switching field variations. Note that a high MR ratio produces a large difference between high and low resistance states which are more easily sensed in the read process.

Prior art teachings can be found that attempt to address at least certain of these problems. Drewes, (U.S. Pat. No. 6,900, 489 B2) teaches a method of reducing the adverse effects of Neel coupling, which is the magnetostatic coupling (ie., the coupling due to edge charges) between the free and pinned layers across the barrier layer. The method of Drewes is to form an additional ferromagnetic layer on the antiferromagnetic pinning layer (layer (10) in FIG. 1 of this application). Drewes asserts that such an additional ferromagnetic layer will reduce the amount of external field required to produce switching of the cell.

Parkin et al. (U.S. Pat. No. 6,166,948) also addresses the adverse effects of magnetostatic interactions by forming a free layer of two oppositely magnetized ferromagnetic layers coupled across a spacer layer. This laminated free layer therefore has closed magnetization loops at its edges and, consequently, is free of uncompensated magnetic poles at those edges (zero divergence of the magnetization), reducing the effects of magnetostatic interaction.

Worledge (U.S. Pat. No. 6,833,573 B3) teaches a method in which a magnetic anisotropy is provided by means of a memory cell having a curved magnetic region.

Accordingly, it is the object of the present invention to provide a new MRAM design wherein the tradeoff between anisotropy and ease of switching does not exist, because the MRAM cell has a divided free layer, producing two separate parts: a read-sensing free layer having little or no anisotropy and an information storage free layer which has the necessary anisotropy to provide a field that aligns the read-sensing layer.

SUMMARY OF THE INVENTION

A first object of this invention is to provide a new design of an MRAM cell structure A second object of the present invention is to provide a new MRAM cell design that eliminates the tradeoff between a free layer that needs magnetic anisotropy so that it can be an effective storage element and a free layer that has a low switching threshold, so it can be an effective element for the writing of information.

A third object of this invention is to provide a cell design that eliminates the switching field threshold variations caused by Neel coupling.

A fourth object of the present invention is to provide a cell design that eliminates switching threshold variations cased by uncompensated edge poles on the free and/or pinned layers.

These objects will be met by an MRAM design in which the cell free layer is split into two parts, a read sensing layer (layer 1) and an information storage layer (layer 2), where each part of the free layer is formed in a separate portion of the cell. The read sensing layer (layer 1) will have little or no magnetic anisotropy; so it can have an essentially horizontal circular cross-section or an elliptical cross-section of low aspect ratio. Layer 1 is formed in that part of the cell that includes the pinned, pinning and barrier layers. The second free layer (layer 2), is made magnetically anisotropic, for example, by providing it with a shape anisotropy (eg. it is shaped as a high aspect ratio ellipse or diamond) so that it maintains its magnetization direction corresponding to a logical 1 or 0 when in a quiescent state. This layer is used in the write process, wherein, by virtue of its magnetic anisotropy it stores and maintains the desired digital information and, through its uncompensated edge poles, it provides a magnetostatic field coupling with layer 1 that aligns the magnetization of layer 1 along the pinned layer direction, but oppositely directed to the magnetization of layer 2. The aligned magnetization of layer 1 can subsequently be read to reveal the information stored in layer 2. In effect, the magnetostatic interaction allows layer 1 to serve as a remote sensor of the magnetization of layer 2. Layer 1 can also be super-paramagnetic, having the property that its magnetization can be substantially proportional to any external magnetic field.

BRIEF DESCRIPTION OF THE DRAWINGS

The objects, features, and advantages of the present invention are understood within the context of the Description of the Preferred Embodiment as set forth below. The Description of the Preferred Embodiment is understood within the context of the accompanying figures, wherein:

FIG. 1 is a schematic representation of a prior-art MTJ MRAM device.

FIG. 2 is a schematic representation of a cross-sectional view of a first embodiment of an MRAM circuit incorporating the split free layer of the present invention

DESCRIPTION OF THE PREFERRED EMBODIMENTS

Figure 3:
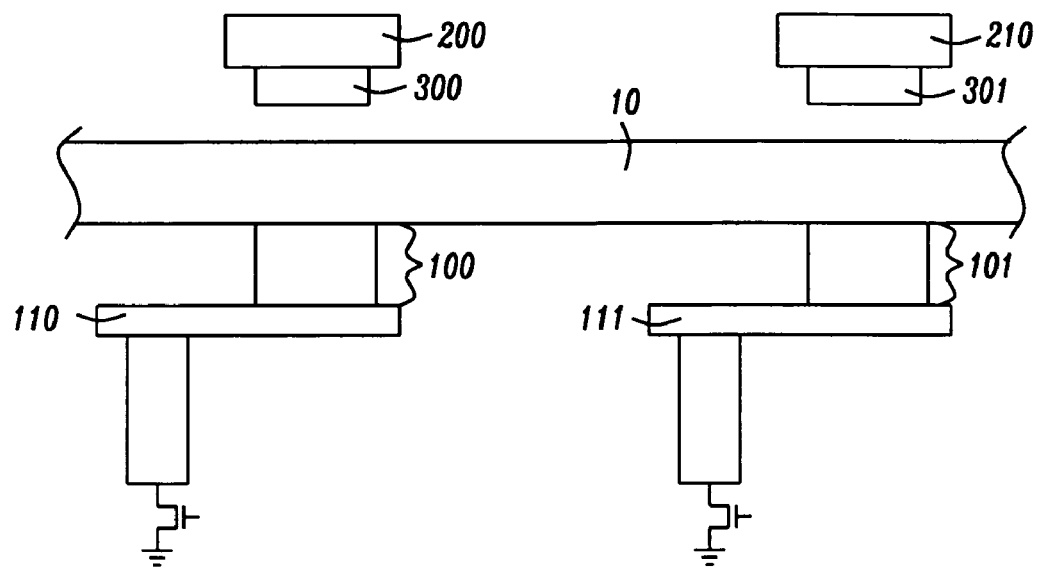
FIG. 3 is a schematic cross-sectional view of a second embodiment of the present invention.

The preferred embodiments of the present invention are MRAM cells and arrays of such cells, having a free layer that is separated into two parts, each part residing in a separate portion of the cell. The first free layer part (layer 1) has little or no magnetic anisotropy and may even be super-paramagnetic, or, if it does have some degree of magnetic anisotropy, that anisotropy will be associated with an easy axis of magnetization that is perpendicular to the easy axis of magnetization of the second free layer part. The first free layer part and its associated cell portion is used by the MRAM cell and its associated circuitry to read the stored information within the cell. The second free layer part (layer 2) has substantial magnetic anisotropy (in order to maintain a magnetization direction of stored information) and is used within the MRAM cell and associated circuitry to store the information that is subsequently read by layer 1. The second layer need only be located sufficiently close to the first layer so that their mutual magnetostatic interaction is sufficient to align the magnetization of the first layer. The two parts of the cell are formed at a vertically separated crossing of a horizontally directed bit line and a word line directed transversely to the bit line. In different embodiments (see below), the two parts of the cell can be within the crossing (ie. above one line and below the other), above or below the crossing, or even horizontally translated relative to the crossing.

Referring first to FIG. 2, there is shown a schematic cross-sectional side view of an array of two cells that provide a first embodiment of the present invention. It is understood that although a pair of cells is illustrated, this is in no way restrictive of the number of cells that can be arrayed using the split free layer configuration. In this embodiment, as will be seen in the illustration, both parts of the cell are formed within the crossing region of the word and bit lines.

Looking from the top of the figure down, there is seen first a common bit line (10) fabricated in the horizontal direction.

Formed beneath the bit line and contacting its lower surface are two partial MRAM cells (100) and (101), hereinafter denoted the first cell portion, each containing only the first free layer part (30), (31) of the split layer free layer. Although these first cell portions have a complete cell layer structure in the sense of cells in the prior art, in the context of the present invention, these are denoted "cell portions" because they serve only the purpose of allowing the value of their resistance state to be read, thereby indicating the value of the stored bit of logical information in the free layer (free layer part 2) of the other portion of the cell (300), (301). In a sense, the cell portions (100) and (101) act as remote sensing devices, allowing the state of a second part of a separated free layer to be determined. For exemplary purposes, the split layer (30) and (31) in each cell portion is shown with its magnetic moment vector pointing either out of (11) or into (12) the figure plane, but it is understood that the magnetization directions of those two first free layer parts are in independent cells and are, therefore, independent of each other. Also shown in both cells are their capping layers (20) and (21), their junction barrier dielectric layers (40) and (41) their pinned (50) and (51) and pinning (60) and (61) layers. The magnetizations of the pinned layers are both shown, for exemplary purposes, as pointing into the figure plane (13) and (14). Thus cell (100) is shown to be in a high resistance state (logical 0) and cell (101) is shown in a low resistance state (logical 1). Each cell contacts a bottom electrode (110) and (111) and, in fact, each partial cell was grown on a seed layer (70) and (71) formed on that bottom electrode. Each bottom electrode is electrically attached to a stud (120) and (121), which is connected to external circuitry (not shown) and can send current into the bottom electrode and through the MRAM partial cell when activated by a gate transistor (130) and (131). The gated current allows the resistance of the cell to be sensed and determines its logical state.

The second part of each cell's free layer (300) and (301) is located (in this embodiment) vertically beneath the electrode and separated from it by a distance sufficient to allow a magnetostatic coupling between the two parts. For lateral cell dimensions between approximately 0.3 and 0.05 microns, a spacing (i.e. a separation) between the two parts of the free layer of between approximately 500 to 2000 angstroms will accomplish the objects of the invention. It is also understood that the ability to decrease free layer dimensions can allow spacings as small as 200 angstroms. As long as the ratio of spacing to lateral dimension is less than 1.0, good magnetostatic coupling between the free layer parts can be obtained.

Part 2 of the free layer (300) and (301) is formed on a seed layer (700) and (710), which, in turn, is formed on a word line (200) and (210) that comes out of the figure plane. The magnetization of the two free layers part 2, (304) and (305) are each directed oppositely to the magnetization of their corresponding free layers 1, as is expected from their magnetostatic interaction. It is understood that the description of this and the following embodiments does not include the method of forming the bit and word lines and of depositing the insulation that surrounds them and the cells. It is well known by those skilled in the art that, typically, a conducting line may be formed in a trench that has been formed in a deposited layer of insulation, or may be formed on a planarized surface of a deposited layer of insulation. Depending upon the configurations of cells, the cells may be formed on an already formed conducting line, or a conducting line may be formed over an already formed cell. In addition, conducting lines may be formed as Cu damascened structures or as single layers of conductor. It is also noted that the write portions of the two cells in each figure are indicated by the labels (300) and (301), which indicate the free layer. It is understood that the free layer is formed on a seed layer, but this layer is not shown for purposes of clarity.

During writing operations the field from the word (200), (210) and bit line (10) currents will set the magnetization of free layer part 2 (300) and (301) to a desired direction along the magnetization direction of the pinned layer (50) and (51). After removal of the word and bit line currents to produce a quiescent state, the magnetization of free layer part 2 will hold its direction because of the magnetic shape anisotropy of free layer part 2. Since free layer part 1 has little or no magnetic anisotropy (or, if it does, it corresponds to an easy axis that is perpendicular to that of the second free layer part), the magnetostatic interaction between free layer part 2 and free layer part 1 (due to non-compensated edge poles on free layer part 2) will then align the magnetization of free layer part 1 in a direction opposite to the magnetization of free layer part 2. This preferred embodiment has the long axis of free layer 2 in the same direction as that of the pinned layer (50) and (51) in the sensing portion of the MRAM cell. In this way, maximum resistance change of the cell is obtained because the relative magnetization directions of free layer 1 and the pinned layer go from parallel to antiparallel. During read operations, the read current will only pass through the read portion of the MRAM cell, between the bottom electrode (110) and (111) and the common bit line (10). It should also be noted that because the read portion (100) and (101) should have a high Dr/r ratio so that their is an easily distinguishable difference between high and low resistance values, the shape and material structure of the free layer 1 can be separately optimized to have such a high ratio using ferromagnetic materials having high Fe content, such as CoFeB, CoFe or NiFe. The free layer in the write and storage portion of the cell, on the other hand, can be independently optimized to have easy switching characteristics, for example by forming it as a single layer of ferromagnetic material on a seed layer as is done in the embodiments presented herein. However, the storage layer, free layer 2, should be capable of maintaining a stable orientation of its magnetization during quiescence. For that purpose, it is endowed with a high degree of magnetic anisotropy.

The following six embodiments, illustrated in FIGS. 3-8, show alternative placements of the write portion of the cell (cell portion 2), the read portion of the cell (cell portion 1) and the word and bit lines. All these individual structures remain the same and fulfill the same functions, it is only their relative placements that differ. The splitting of the free layer and the nature of the magnetostatic interaction between the two free layers allows great flexibility in cell layout, while not sacrificing the advantageous operation of the invention. In each figure, blank surrounding portions are understood to contain insulation.

Referring next to FIG. 3, there is shown a schematic side cross-sectional view of a second embodiment, which is a split free layer construction applied to a pair of MRAM cells. It is understood that the pair of MRAM cells is exemplary only and the same configuration in this embodiment can be applied to one cell or a plurality of cells. In this second embodiment, each read portion (the first cell portion containing free layer part 1) of the split layer device (100) and (101), is formed on a bottom electrode (110) and (111) and is contacted from above by the common bit line (10) exactly as in the first embodiment (see FIG. 2 for greater detail). Each write portion (300) and (301) of the split layer construction (cell portion 2 containing free layer part 2) is formed above the common bit line and is contacted from above by a word line (200) and (201). The free layer part 2 is formed on a seed layer within a trench in the surrounding insulation or may be formed on a seed layer deposited on a well planarized layer of insulation. An advantage of this configuration is that whatever flux emerges from the uncompensated poles of free layer part 1 will assist in the writing of free layer part 2.

Figure 4:
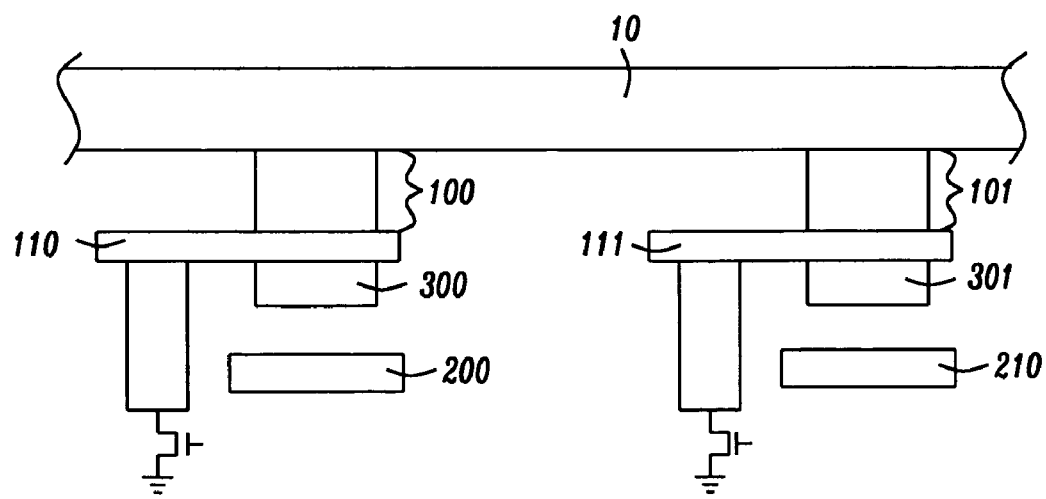
FIG. 4 is a schematic cross-sectional view of a third embodiment of the present invention.

Referring next to FIG. 4, there is shown a schematic side cross-sectional view of the split free layer construction applied to an exemplary pair of MRAM cells. It can be seen that the read portion of the cell (100) and (101) is formed beneath the common bit line, on a bottom electrode, exactly as in the first two embodiments. In this embodiment, however, the write portion of the cell (300) and (301), is formed beneath the bottom electrode (110), (111) so as to contact the bottom surface of the bottom electrode, and above the two word lines (200) and (210). The write portion is separated from the word line by insulation, which is represented by the separation shown in the figure.

Figure 5:
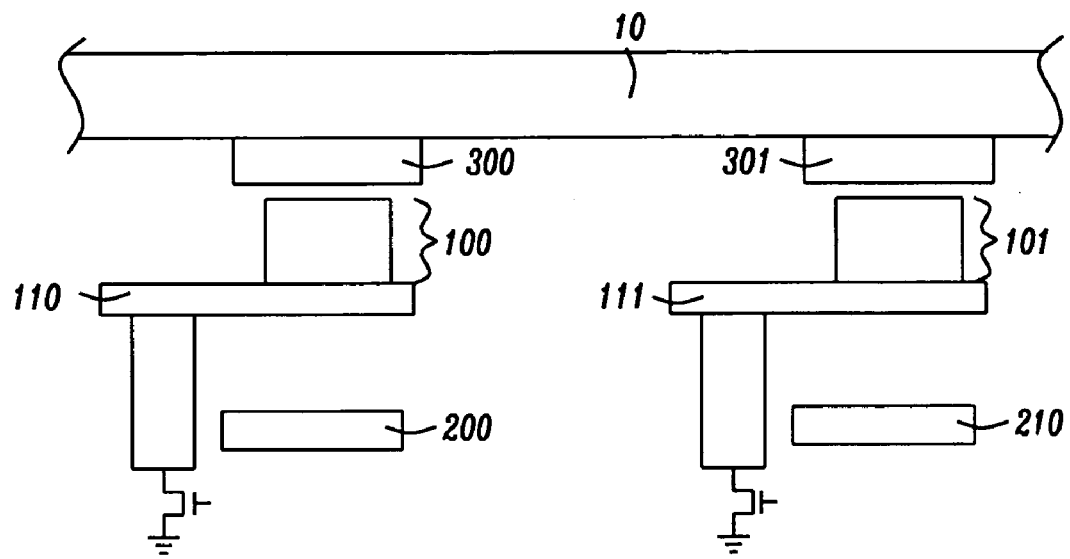
FIG. 5 is a schematic cross-sectional view of a fourth embodiment of the present invention.

Referring next to FIG. 5, there is shown a schematic side cross-sectional view of the split free layer construction applied to an exemplary pair of MRAM cells, in which the read portions (100) and (101) of the split cell and the write portions (300) and (301) are formed adjacent to each other (but insulated from each other), beneath the common bit line. The two word lines (200) and (210) are each vertically beneath and insulated from the bottom electrode.

Figure 6:
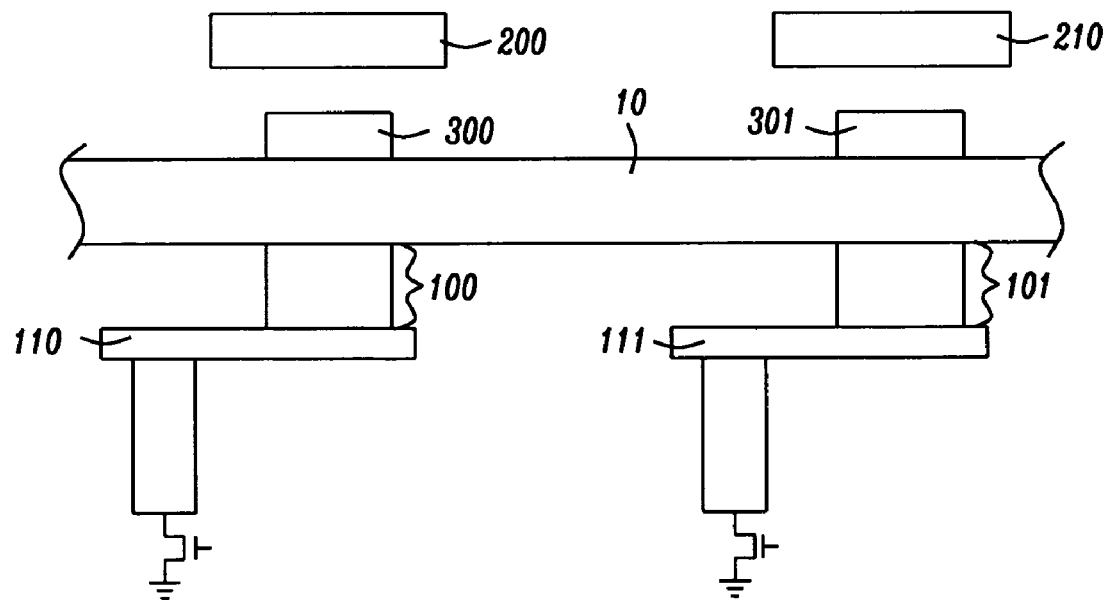
FIG. 6 is a schematic cross-sectional view of a fifth embodiment of the present invention.

Referring next to FIG. 6, there is shown a schematic side cross-sectional view of the split free layer construction applied to an exemplary pair of MRAM cells, in which the two word lines are positioned above the common bit line (10). Thus, in this embodiment, the read portions of the cells (100) and (101) are beneath both the word and bit lines. The write portion of the cells (300) and (301) are formed on the common bit line and are vertically below their respective word lines (200) and (210).

Figure 7:
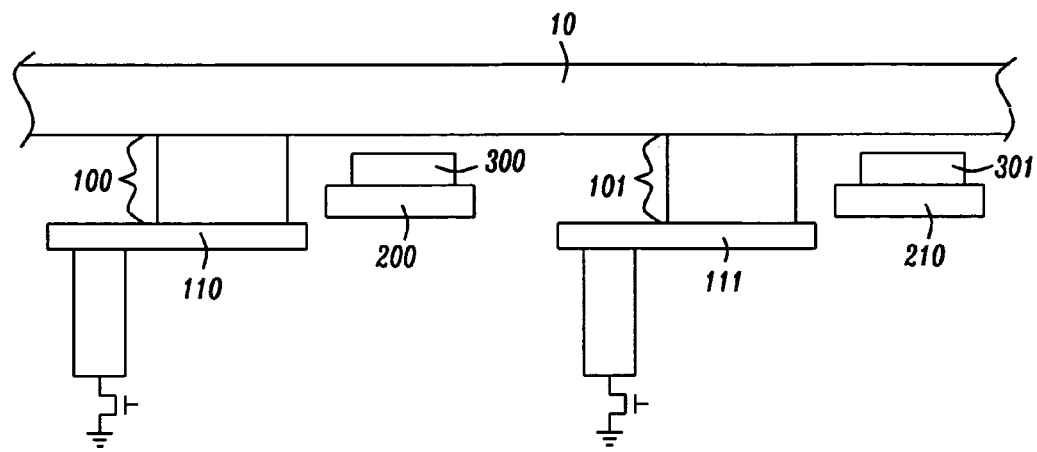
FIG. 7 is a schematic cross-sectional view of a sixth embodiment of the present invention.

Referring next to FIG. 7, there is shown a schematic side cross-sectional view of the split free layer construction applied to an exemplary pair of MRAM cells, in which the two word lines (200) and (210), each with a free layer 2 formed upon it (300) and (301), are positioned below the common bit line (10) and laterally translated with respect to the read portions of the cell (100) and (101). In this configuration, the write free layers (free layer part 2) (300) and (301) are horizontally separated from the read free layers (free layer part 1) (300) and (301), but the magnetostatic interaction between the two free layer parts still allows the write free layer to orient the magnetization of the read free layer in an opposite direction.

Figure 8:
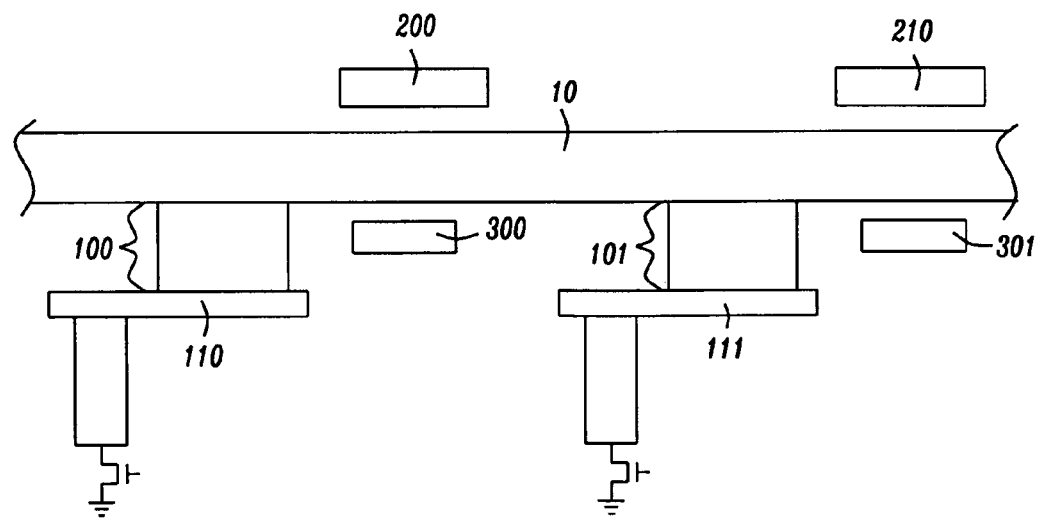
FIG. 8 is a schematic cross-sectional view of a seventh embodiment of the present invention.

Referring finally to FIG. 8, there is shown a schematic side cross-sectional view of the split free layer construction applied to an exemplary pair of MRAM cells, in which the write free layer (300) and (301) is laterally translated relative to the read portion of the cell (100) and (101), but the two word lines (200) and (201) are now vertically above the write free layer and the bit line (10). This embodiment is thus similar to that in FIG. 8 with the exception of the position of the word lines.

It should be apparent to those skilled in the art that linear arrays comprising a plurality of any of the split cell structures described above can be readily fabricated by forming (for example) a common bit line, an array of parallel, horizontally separated word lines that are vertically below (or above) the bit line, and then forming the split cell structures within the crossing regions between the bit line and the word lines. In short, the fabrication of such an array is the sequential repetition of any of the two split cell structures already described with reference to FIGS. 3-8.

As is finally understood by a person skilled in the art, the preferred embodiments of the present invention are illustrative of the present invention rather than limiting of the present invention. Revisions and modifications may be made to methods, materials, structures and dimensions employed in forming and providing the split free layer MRAM cell and an array of such cells, while still forming and providing such a cell and array of such cells and their method of formation in accord with the spirit and scope of the present invention as defined by the appended claims.

What is claimed is:

1. An MRAM cell having a free layer formed in two magnetized parts, a first free layer part from which stored information is read and a second free layer part on which said information is written and stored comprising:

a first cell portion for reading stored information including a pinned layer, a tunneling barrier layer and said first free layer part, said first cell portion having a resistance value depending on the relative orientations of the magnetization of said first free layer part and the magnetization of said pinned layer; and said first free layer part having very little or no magnetic anisotropy or having magnetic anisotropy wherein an easy magnetic axis of said first free layer part is directed perpendicularly to an easy magnetic axis of said second free layer part; and a second cell portion including said second free layer part, in which said second cell portion information can be written and stored in accord with the magnetization direction of said second free layer part and said second free layer part having a magnetic anisotropy to maintain said magnetization direction in the absence of an external magnetic field; and wherein the horizontal dimensions of said first and second free layer parts and a spacing formed therebetween permits the formation of a magnetostatic interaction between said first and second free layer parts, whereby the magnetization of said second free layer part orients a magnetization of said first free layer part in an opposite direction thereto.

2. The cell of claim 1 further including circuitry for measuring the resistance of said first cell portion and thereby determining the magnetization direction of said first free layer part and, because the magnetizations of said first free layer part and said second free layer part are held by magnetostatic interaction in opposite directions, also determining the magnetization direction of said second free layer part.

3. The cell of claim 1 wherein said first cell portion is an MTJ cell comprising:

a conducting bottom electrode forming a lower surface of said first cell portion;

a seed layer formed on said electrode;

a pinning layer formed on said seed layer;

said pinned layer formed on the pinning layer, wherein the magnetization of said pinned layer is uni-directionally pinned by the pinning layer;

said tunneling barrier layer formed on said pinned layer;

said first free layer part formed on the tunneling barrier layer wherein said first free layer part has little or no magnetic anisotropy or wherein its said easy magnetic axis is directed transversely to said easy magnetic axis of said second free layer part, whereby a magnetization of said first free layer part is directed oppositely to said magnetization of said second layer part as a result of a magnetostatic interaction therewith;

a capping layer formed on said first free layer and forming an upper surface of said first cell portion.

4. The cell of claim 1 wherein said second free layer part is formed with magnetic anisotropy in the direction of the magnetization of said pinned layer.

5. The cell of claim 1 wherein said first free layer part is formed of ferromagnetic material producing a high MR ratio, Dr/r.

6. The cell of claim 1 wherein said first free layer part is formed of layers or laminated layers of alloys of Co, Fe, Ni and B of thickness between approximately 5 and 100 angstroms.

7. The cell of claim 1 wherein said first free layer part has a horizontal cross-sectional shape that is circular or elliptical with low aspect ratio between approximately 1 and 2, said free layer, thereby, having little or no magnetic shape anisotropy.

8. The cell of claim 1 wherein said first free layer has a horizontal cross-sectional shape having perpendicular long and short axes of symmetry and wherein the ratio of the length of the long axis to the short axis is between approximately 1:1 and 2:1.

9. The cell of claim 1 wherein said second free layer is made of layers or laminated layers of alloys of Co, Fe, Ni and B of thickness between 5 and 200 angstroms.

10. The cell of claim 1 wherein the second free layer is formed with substantial magnetic shape anisotropy to provide two stable states of magnetization direction during quiescence.

11. The cell of claim 1 wherein said second free layer has a horizontal cross-sectional shape having perpendicular long and short axes of symmetry and wherein the ratio of the length of the long axis to the short axis is between 1 and 10:1.

12. The cell of claim 1 wherein the horizontal dimensions of said first and second cell portions are between approximately 0.3 and 0.05 microns and wherein the spacing between said first and second free layer parts is between approximately 500 and 2000 angstroms.

13. The cell of claim 3 wherein said pinning layer is a layer of antiferromagnetic material.

14. The cell of claim 3 wherein said pinned layer is a laminate of two ferromagnetic layers coupled antiferromagnetically by a non-magnetic layer of Ru, Cr, Cu or Rh.

15. The cell of claim 3 wherein said tunneling barrier layer is a layer of oxidized Al, Ti, Hf, or Mg or laminates of such oxides and their nitrides and oxynitrides.

16. The cell of claim 3 wherein said first free layer part has a weak magnetic shape anisotropy substantially in the same direction as the magnetization of said pinned layer.

17. The cell of claim 1 further including a horizontally directed bit line and word line, said bit line being vertically above and perpendicular to said word line and wherein said first cell portion is formed vertically beneath said bit line and said second cell portion is formed vertically above said word line and said first and second cell portions are vertically aligned and insulated from each other.

18. A linear array of MRAM cells, wherein each cell is formed as two separated cell portions, a first cell portion that includes a first free layer part from which data is read and a second cell portion that includes a second free layer part in which data is written and stored comprising:

a bit line extending in a first direction in a first horizontal plane;

a plurality of uniformly spaced, parallel word lines extending in a second horizontal plane vertically separated from said first horizontal plane, said second direction being transverse to said first direction and each of said word lines thereby forming a vertically separated crossing with said bit line;

an MRAM cell formed at each crossing, wherein each cell further comprises:

said first cell portion including a pinned layer and a first free layer part, said cell portion having a resistance value depending on the relative orientations of the magnetization of said first layer part and the magnetization of said pinned layer; and said second cell portion including a second free layer part, on which second cell portion information can be written and stored in accord with the magnetization direction of said second free layer; and wherein a magnetostatic interaction occurs between said first and second free layers whereby the magnetization of said second free layer orients a magnetization of said first free layer in an opposite direction.

19. The linear array of claim 18 further including circuitry for measuring the resistance of said first cell portion of each said MRAM cell, whereby the magnetization of said first free layer part can be determined and, because the magnetizations of said first free layer part and said second free layer part are maanetostatically coupled in opposite directions, the magnetization direction of said second free layer part can be determined.

20. The cell of claim 1 further including a horizontally directed bit line and word line, said word line being vertically above and perpendicular to said bit line and wherein said second cell portion is formed vertically beneath said word line and above said bit line and insulated from said bit line and said first cell portion is formed vertically beneath said bit line and said first and second cell portions are vertically aligned.

21. The cell of claim 1 further including a horizontally directed bit line and word line, said bit line being vertically above and perpendicular to said word line and wherein said first cell portion is formed vertically beneath said bit line and said second cell portion is formed vertically directly beneath and aligned with said first cell portion and vertically above and insulated from said word line.

22. The cell of claim 1 further including a horizontally directed bit line and word line, said bit line being vertically above and perpendicular to said word line and wherein said second cell portion is formed vertically beneath said bit line and said first cell portion is formed vertically directly beneath and aligned with said second cell portion and vertically above and insulated from said word line.

23. The cell of claim 1 further including a horizontally directed bit line and word line, said word line being vertically above and perpendicular to said bit line and wherein said second cell portion is formed on said bit line and vertically beneath and insulated from said word line and said first cell portion is formed vertically beneath said bit line and said first and second cell portions are vertically aligned.

24. The cell of claim 1 further including a horizontally directed bit line and word line, said bit line being vertically above and perpendicular to said word line and wherein said first cell portion is formed beneath said bit line and said second cell portion is formed on said word line but is laterally displaced from said first cell portion so that said first free layer part and said second free layer part are substantially co-planar but laterally displaced from each other.

25. The cell of claim 1 further including a horizontally directed bit line and word line, said word line being vertically above and perpendicular to said bit line and wherein said first cell portion is formed beneath said bit line but is laterally displaced from said word line and said second cell portion is formed beneath said bit line and vertically beneath said word line and is thereby laterally displaced from said first cell portion and whereby said first free layer part and said second free layer part are horizontally coplanar and laterally displaced from each other.

* * * * *